United States Patent
Post et al.

(10) Patent No.: US 10,545,695 B2
(45) Date of Patent: Jan. 28, 2020

(54) SOLID STATE DRIVE CONTROLLER

(71) Applicant: Micron Technology, Inc., Boise, ID (US)

(72) Inventors: Samuel D. Post, San Jose, CA (US); Eric Anderson, Sacramento, CA (US)

(73) Assignee: Micron Technology, Inc., Boise, ID (US)

( * ) Notice: Subject to any disclaimer, the term of this patent is extended or adjusted under 35 U.S.C. 154(b) by 203 days.

(21) Appl. No.: 15/434,503

(22) Filed: Feb. 16, 2017

(65) Prior Publication Data

US 2017/0160977 A1    Jun. 8, 2017

Related U.S. Application Data

(63) Continuation of application No. 12/650,035, filed on Dec. 30, 2009, now Pat. No. 9,612,775.

(51) Int. Cl.
*G06F 12/02* (2006.01)
*G06F 3/06* (2006.01)

(52) U.S. Cl.
CPC .......... *G06F 3/0635* (2013.01); *G06F 3/0611* (2013.01); *G06F 3/0613* (2013.01); *G06F 3/0644* (2013.01); *G06F 3/0673* (2013.01); *G06F 3/0679* (2013.01); *G06F 12/0246* (2013.01)

(58) Field of Classification Search
None
See application file for complete search history.

(56) References Cited

U.S. PATENT DOCUMENTS

| | | | |
|---|---|---|---|
| 6,249,802 B1* | 6/2001 | Richardson | G06F 9/5016 709/200 |
| 6,792,506 B2* | 9/2004 | Solomon | G06F 3/0613 710/22 |
| 7,707,366 B2* | 4/2010 | Tagawa | G06F 13/1647 711/105 |
| 7,725,622 B2 | 5/2010 | Rubidge et al. | |
| 7,987,306 B2* | 7/2011 | Muller | G06F 13/28 710/240 |
| 9,442,866 B1 | 9/2016 | Post et al. | |
| 2002/0099909 A1* | 7/2002 | Meyer | G06F 12/0835 711/117 |
| 2003/0115403 A1 | 6/2003 | Bouchard et al. | |
| 2004/0259563 A1 | 12/2004 | Morton et al. | |
| 2005/0223179 A1 | 10/2005 | Perego et al. | |
| 2006/0069766 A1 | 3/2006 | Hamilton et al. | |
| 2007/0101096 A1 | 5/2007 | Gorobets | |
| 2007/0105576 A1 | 5/2007 | Gupta et al. | |
| 2011/0125977 A1 | 5/2011 | Karr et al. | |

* cited by examiner

*Primary Examiner* — Charles Rones
*Assistant Examiner* — Ryan Dare
(74) *Attorney, Agent, or Firm* — Brooks, Cameron & Huebsch, PLLC

(57) ABSTRACT

A memory device may comprise circuitry to adjust between latency and throughput in transferring information through a memory port, wherein the circuitry may be capable of configuring individual partitions or individual sectors as high-throughput storage or low-latency storage.

19 Claims, 4 Drawing Sheets

SOLID STATE DRIVE CONTROLLER

PRIORITY APPLICATION INFORMATION

This application is a Continuation of U.S. application Ser. No. 12/650,035 filed on Dec. 30, 2009, the contents of which are incorporated herein by reference in its entirety.

BACKGROUND

Field

Subject matter disclosed herein relates to accessing memory devices.

Information

Solid State Drives (SSDs) offer many advantages over Hard Disk Drives (HDDs). SSDs provide faster execution, lower power consumption, and are not susceptible to mechanical failures, such as head crashes. Because SSDs are typically based on NAND flash devices, there is a practical limit to how much impact channel design has on latency—specifically, splitting a sector across multiple NAND devices results in performance degradation. Contrastingly, other non-volatile devices such as phase change memory (PCM) allow further optimizations at the channel level which can reduce latency. Regardless of the specific memory technology used, such drives may be tailored, at a manufacturing or original equipment manufacturer's facility, to reduce latency as much as possible, often at the expense of the drive's throughput. Unfortunately, a drive's use may vary over time, and low latency operations (a database table update, for example) may give way to operations that would benefit most from high throughput (the transfer of large files for streaming video, for example). Similarly, high throughput operations may give way to operations that would benefit most from low latency.

BRIEF DESCRIPTION OF THE FIGURES

Non-limiting and non-exhaustive embodiments will be described with reference to the following figures, wherein like reference numerals refer to like parts throughout the various figures unless otherwise specified.

DETAILED DESCRIPTION

Solid state memory organized in channels, such as may be found in a multi-channel solid state drive, for example, may be used to service a variety of requests. Such a request may include read or write requests, may be directed from an application or driver to a controller, and may be best-served by low-latency access to information stored in the memory, by high-throughput access to the information or, alternatively, by an intermediate approach that balances throughput and latency. Because different requests may be best suited for different approaches (high-throughput or low-latency, for example) solid state memory controllers that are tailored to emphasize one approach (high-throughput, for example) operate disadvantageously with another (low-latency, for example). In an example embodiment, a solid state memory controller may include user interface circuitry and/or firmware or microcode that allows a user to adjust one or more characteristics of one or more requests to thereby accommodate high-throughput, low-latency, or an intermediate form of operation. However, this is merely an example embodiment, and claimed subject matter is not limited in this respect. In the context of this disclosure, the term "user" may refer, not just to a human end-user, but to any user, who may employ features of a memory controller including, an application-designer, a driver-designer, or operating system-designer, for example.

Figure 1:
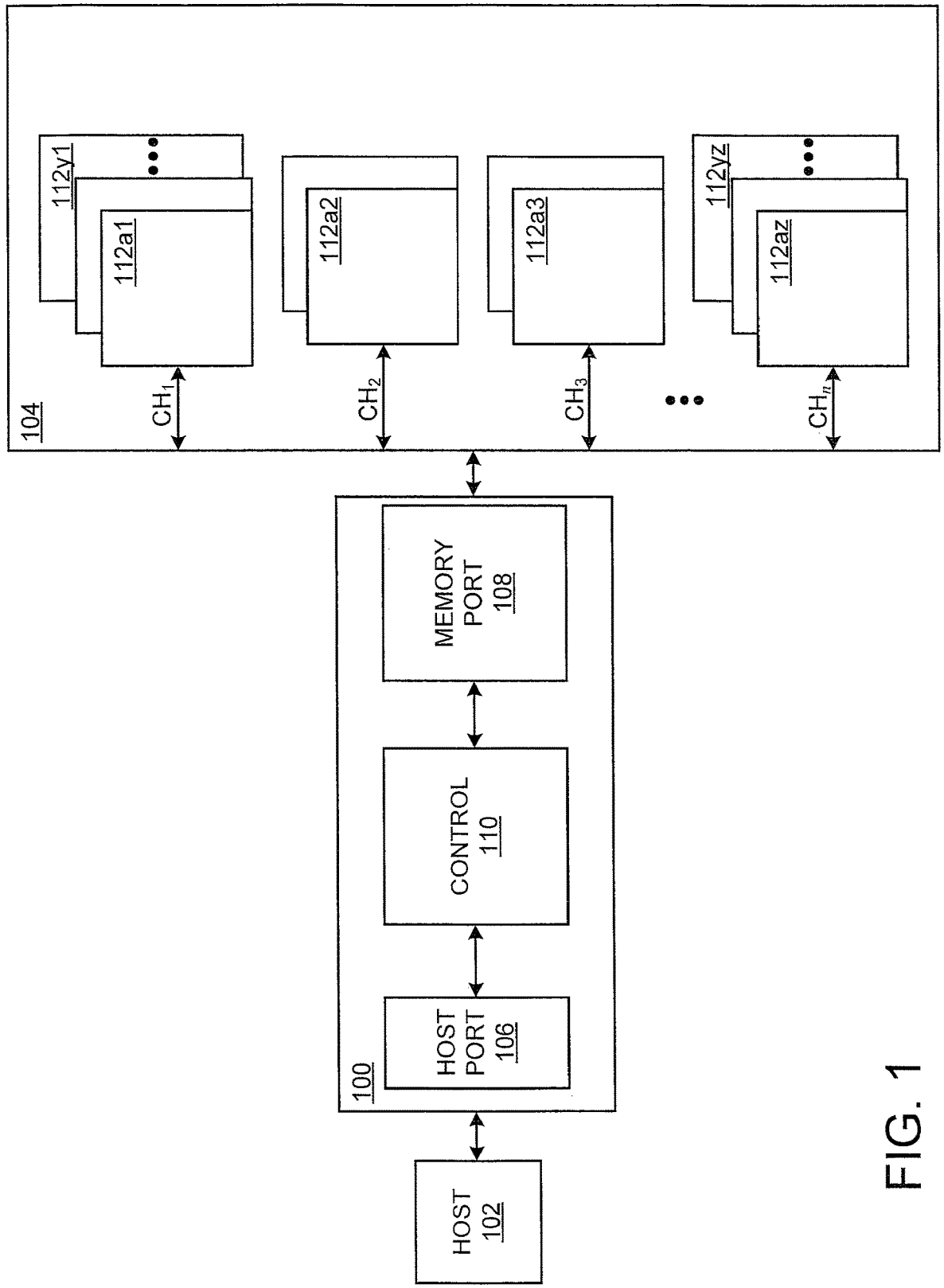
FIG. 1 is a schematic block diagram of a system that may employ a controller in accordance with an embodiment.

FIG. 1 shows an illustrative embodiment of a solid state memory controller 100 which is coupled to a host processor 102 and memory array 104, respectively, through host port 106 and memory port 108. Solid state memory controller 100 may comprise a Solid State Drive (SSD) controller, for example. However, other types of solid state memory controllers may be used. Solid state memory controller 100 includes control circuitry 110 responsive to user input regarding low-latency or high-throughput servicing of requests for storage and retrieval of information from an associated memory array. Control circuitry 110 may service requests through memory port 108 to a memory array 104. In an illustrative embodiment, memory array 104 includes memory devices 112$a$1-112$yz$ arranged in n channels, CH1-CHn. Channels CH1-CHn may be implemented as known channels, such as Serial Advanced Technology Attachment (SATA) or Peripheral Component Interconnect Express (PCIE) channels, for example. Another channel (not shown) may comprise an interface to individual controllers associated with channels CH1-CHn in accordance with the principles of the claimed subject matter. In such an embodiment one or more of the channels CH1-CHn may have associated with it a controller (not shown) that provides queuing and other I/O processes. In other embodiments, a "channel" may comprise any physical structure capable of transmitting information between a memory device and another device. Alternatively, such a channel may comprise a virtual channel for transmitting information between a memory channel and another device. Of course, these are merely examples of a channel discussed for the purpose of illustration, and claimed subject matter is not limited in this respect, Control circuitry 110 may service a low-latency request by distributing information associated with such a request over a relatively high number of memory channels and service high-throughput requests by distributing information associated with such a request over a relatively low number of memory channels in an illustrative embodiment. Highest-throughput requests may engage as few as a single memory channel, and lowest latency requests may engage as many as all available memory channels, for example. Overhead associated with setting up a single channel may be less than that associated with setting up a plurality of channels for transmitting the same data. Consequently, throughput may be greater if a single channel is employed for a given request, although latency may be less if multiple channels are employed to service a request. Such overhead may include channel initialization, determination of data location, channel availability, bus arbitration and availability, and organizing a command queue, for example. In illustrative embodiments, memory array 104 may be organized hierarchically, with one or more drives at a top level, a drive including partitions, and a partition including sectors. In such an embodiment partitions or sectors and may be configured for low-latency or high-throughput operation on drive-wide, partition-by-partition, or sector-by-sector bases Memory port 108 may be adapted to communicate with a memory array 104 located within the same integrated circuit as solid state memory controller 100 or located in one or more separate integrated circuits, for example.

In an illustrative embodiment, memory devices 112a1-112yz may be implemented as nonvolatile memory devices that allow for fine-grained access. In a particular example, Phase Change Memory (PCM) memory devices are such devices. However, this is merely an example of a nonvolatile memory device having fine-grained access capability that may be used and claimed subject matter is not limited in this respect. In particular embodiments memory cells within PCM memory devices may be addressed in relatively small groups, such as word, byte, or even bit. Such fine-grained access is contrasted with a very course granularity of access afforded by such conventional non-volatile memory devices as NAND flash memory devices, which may be accessed in relatively large blocks. A further advantage of PCM devices is that, unlike flash devices, the memory cells may be directly over-written. In certain conditions, NAND flash devices may require that the contents of an entire block be copied out, the block erased, the old contents revised to reflect new information, then the block rewritten with the revised data. As a result, PCM devices may feature substantially reduced latency in comparison with flash devices. A user-configurable memory controller capable of adjusting latency and throughput may take particular advantage of memory devices such as PCM devices, for example. That is, a solid state memory controller 100 in accordance with an embodiment may capitalize on low-latency attributes of nonvolatile memory devices such as PCM memory devices by adjusting the distribution of information associated with a request to a plurality of channels, for example. As will be described in greater detail in the discussion related to the following figures, control circuitry 110 may include user-interface circuitry to monitor requests from a host 102, and adjust execution of such requests to yield lower latency (for a database table update, for example) by distributing requests across more channels within a memory array 104, or to yield higher throughput (for streaming video, for example) by distributing requests to a lesser number of channels.

In an embodiment in which memory devices 112yz comprise PCM devices, memory devices 112yz may include single level cells (SLC), multilevel cells (MLC), or a combination of both, and may be hierarchically organized into banks of memory cells. A bank of memory cells may have its own chip enable signal terminal associated with it. Solid state memory controller 100 may access more than one bank in a PCM device at the same time, and may access different banks in different PCM devices at the same time. Solid state memory controller 100 may engage a plurality of memory channels CH1-CHn simultaneously and thereby reduce the latency of an SSD that includes solid state memory controller 100. In particular implementations, a greater number of channels CH1-CHn employed for a given request from a host may lower a latency associated with the execution of the request. Likewise, a fewer number of channels CH1-CHn associated with the execution of such a request, the greater the throughput.

A solid state drive that includes solid state memory controller 100 may include a memory array 104 in which a channel from among CH1-CHn may be configured to receive one or more control signals, such as chip enable signals. In an illustrative embodiment, chip enable signals of PCM memories associated with a given channel may be activated in concert. In an illustrative embodiment each PCM device 112yz may include a command/address/data multiplexed interface for the interchange of data, address, and control signals through corresponding input/output pins. A PCM device 112yz may be connected to a separate channel CH1-CHn. Alternatively, a plurality of PCM devices 112yz may be connected to a channel. A channel from among channels CH1-CHn may include one or more input and output lines, chip select signal lines, chip enable signal lines, write enable, read enable, read/busy output, or reset signal lines, for example.

Figure 2:
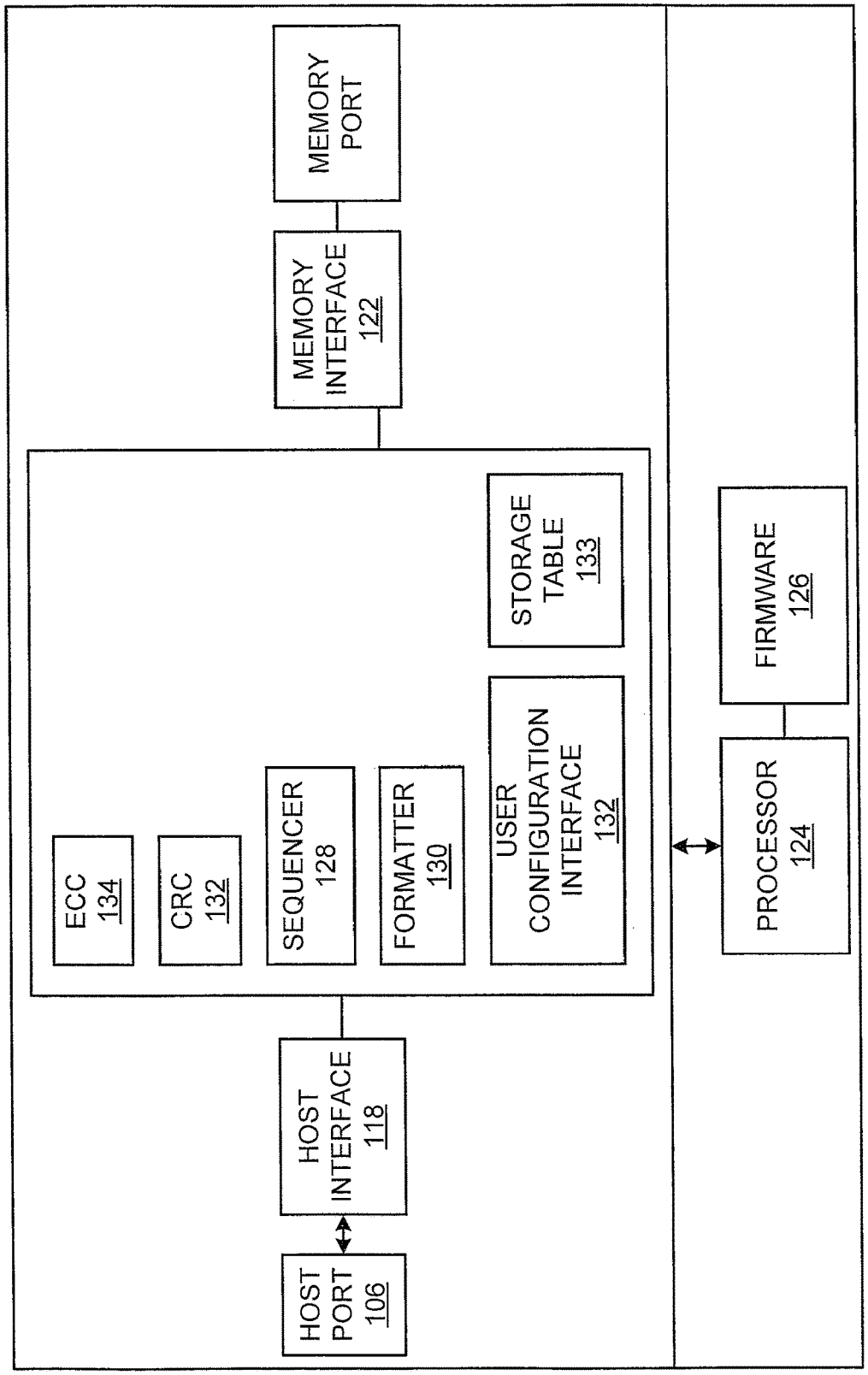
FIG. 2 is block diagram of a controller in accordance with an embodiment.

FIG. 2 is a more-detailed block diagram of an illustrative embodiment of a solid state memory controller 100. In this illustrative embodiment, information may be transmitted between solid state memory controller 100 and a host (such as host 102 of FIG. 1) through host interface port 116 in conformity with host interface 118. Information may be transferred between a memory array (such as memory array 104 of FIG. 1) and solid state memory controller 100 through memory interface port 120 in conformity with memory interface 122.

In this illustrative embodiment, solid state memory controller 100 includes a processor 124 which operates under control of firmware 126, however, functions performed by processor 124 and firmware 126 could be performed by programmable logic, such as gate arrays, or microcode engines in combination with microstore, for example. Solid state memory controller 100 may also include sequencer 128, formatter 130, cyclic redundancy check (CRC) circuitry 131, and error correction code (ECC) circuitry 134. CRC circuitry 131, ECC circuitry 134, sequencer 128, and formatter may operate to detect and correct errors, and to format and store information in a memory array 104, for example. However, these are merely examples of particular information storage and retrieval formats that may be implemented, and claimed subject matter is not limited in this respect. Host interface 118 may incorporate features of, or comply with, a standard interface such as, for example, a Serial Advanced Technology Attachment (SATA) interface or a Parallel Advanced Technology Attachment (PATA) interface. Host interface 118 may include one or more registers in which operating commands and addresses, for example, from host 102 may be temporarily stored. Host interface 118 may communicate a request (a write or read command, for example) from host 102 to processor 124 based on information stored in register(s). Processor 124 may be implemented in a variety of technologies, architectures, and levels of complexity.

User-configurable interface 132 may include registers and tables employed by processor 124 to map information from a host 102 into a memory array 104. Information received from a host 102 may be addressed in the form of logical block addresses supplied by a driver, for example. In various embodiments, user-configurable interface 132 may include all or part of processor 124 or may employ a separate processor, for example. User-configurable interface 132 may be configured by a user through a user interface, through an application program, through a driver program, or through an operating system command, for example. A video application may, for example, include a command to configure video information storage within array 104 as high throughput storage, or a database application may include a command to configure information storage within array 104 as low latency storage, for example. In accordance with an embodiment, a memory within array 104 may be arranged and configured on an array-wide, partition-by-partition, or sector-by-sector basis, for example. Such configuration information may be maintained within a configuration lookup/storage table 133 in accordance with the principles of claimed subject matter.

Figure 3:
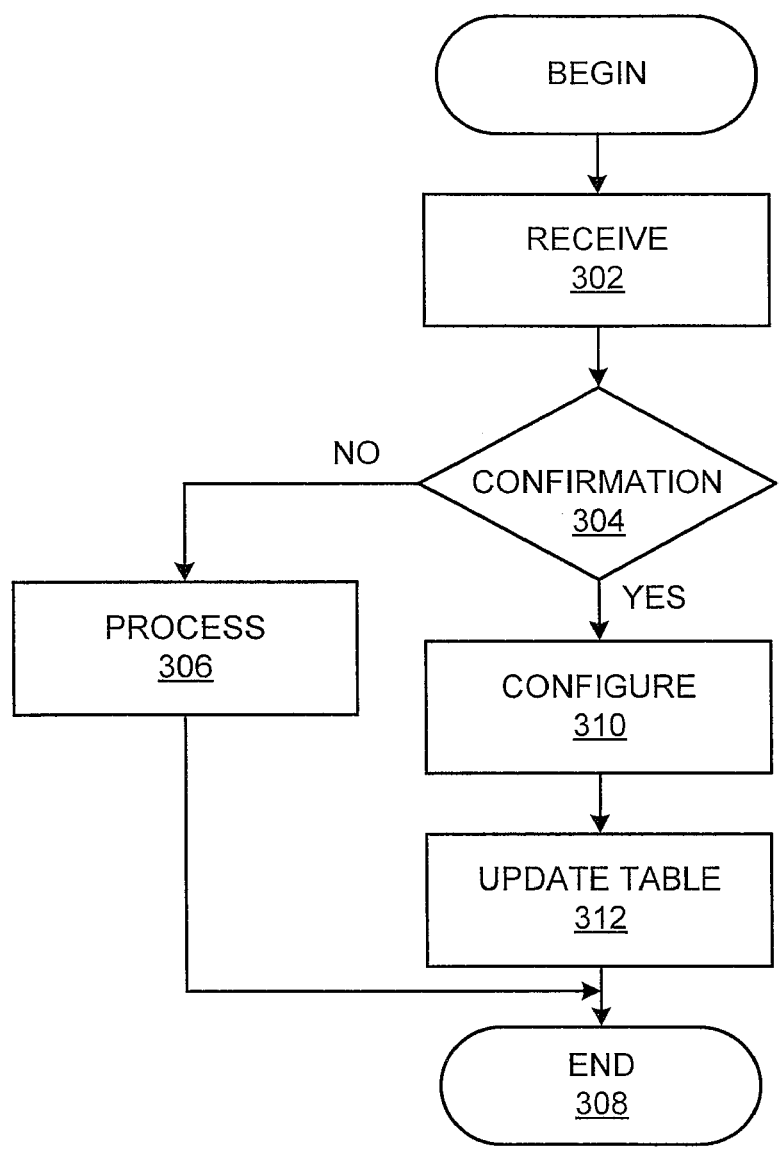
FIG. 3 is a flow chart depicting an illustrative sequence of an embodiment of a process for accessing memory devices.

A process configuring a multi-channel array for high-throughput or low latency operation in a multi-channel array in accordance with a particular example implementation is described in greater detail in the discussion related to FIG. 3. In an illustrative embodiment, user-configurable interface 132 may include circuitry to recognize control information from a driver or file system that determines whether to employ low-latency or high-throughput storage throughout array 104, within specific partitions, or within specific sectors of array 104. Such control information may be in the form of a command from a user interface, from an application, or from a driver, for example.

The flow chart of FIG. 3 depicts an illustrative embodiment of a user-configurable process for processing memory requests. In one particular implementation, process 300 may be performed, in whole or in part, by an SSD. However, this is merely one particular implementation of process 300 and claimed subject matter is not limited in this respect. At block 302 a solid state memory controller may receive a request. Such a request may take the form of a write request or a read request from a host processor, such as host processor 102 described in the discussion related to FIGS. 1 and 2, for example. Alternatively, the request may take the form of a configuration instruction from a user, an application, or a driver, for example. At 304, a solid state memory controller may determine whether a request received at block 302 is a configuration request or a request such as an I/O request. If it is determined that a request received at block 302 is not a configuration request, in block 306 a request is serviced by controller 100. Requests are serviced according to a configuration map, as indicated by information in a configuration table 133. That is, an array 104, or partitions, or sectors within array 104 may be configured as high throughput or low latency, and associated locations are to be accessed through single or multi-channel operation respectively. The process proceeds to block 308 where it ends or returns to block 302 to service more requests If is determined at 304 that a request is a configuration request, block 310 configures the associated array, partition, or sector, as high-throughput or low-latency according to the request. At block 312 configuration table, such as table 133, is updated to reflect the reconfiguration of step 310 and, from there, the process proceeds to block 308 where it ends or returns to block 302 to service more requests. Process 300 may continue as a component of a larger process in which this sub-process is looped through continuously while a solid state memory controller is operating.

In an illustrative embodiment a table may be employed to maintain the low-latency/high throughput status of a sector and if a memory sector is placed in a given mode (e.g., high throughput or low latency), it would remain in that mode until the table is modified. In order to reduce the likelihood that high throughput requests interfere with low-latency requests, in accordance with the principles of the claimed subject matter a queue-ordering process, with low-latency requests placed ahead of high throughput requests, where possible, may be employed. In such an illustrative embodiment, before execution of commands in the queue a controller in accordance with the principles of the claimed subject matter may scan the command list and move low-latency requests ahead of high throughput requests.

Figure 4:
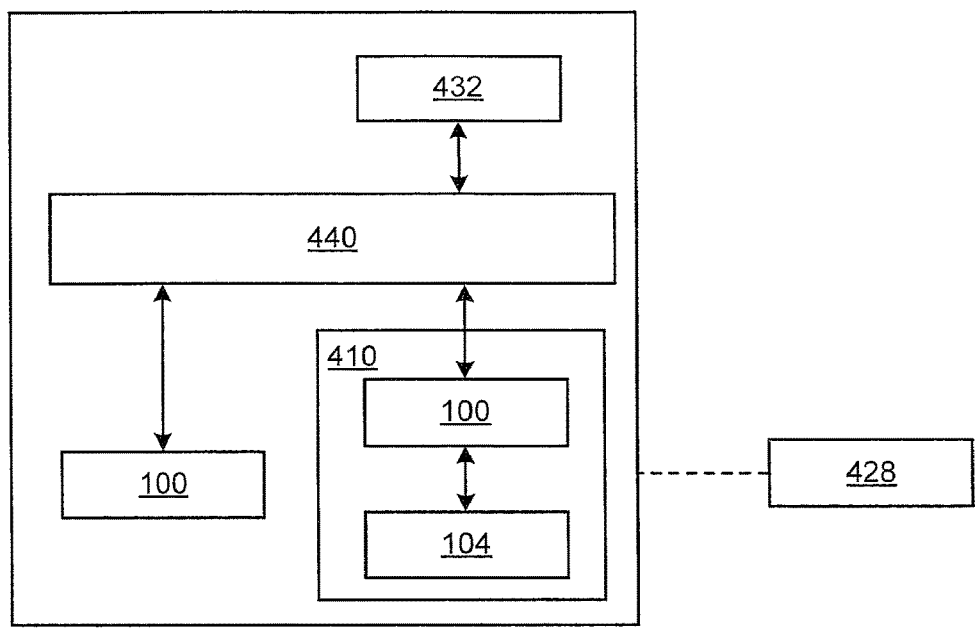
FIG. 4 is a block diagram of a computing system such as may employ a controller in accordance with an embodiment.

The schematic block diagram of FIG. 4 depicts an illustrative embodiment of a computing system 400 that includes a user-configurable solid state memory controller, such as an SSD controller. Such a computing device may comprise one or more processors, for example, to execute an application and/or other code. User-configurable SSD 410 may include a user-configurable solid state memory controller 100 and a multi-channel nonvolatile memory array 104. By way of example but not limitation, computing device 404 may include: one or more computing devices and/or platforms, such as, e.g., a desktop computer, a laptop computer, a workstation, a server device, or the like; one or more personal computing or communication devices or appliances, such as, e.g., a personal digital assistant, mobile communication device, or the like; a computing system and/or associated service provider capability, such as, e.g., a database or data storage service provider/system; and/or any combination thereof.

It is recognized that all or part of the various devices shown in system 400, and the processes and methods as further described herein, may be implemented using or otherwise including hardware, firmware, software, or any combination thereof. Thus, by way of example but not limitation, computing device 404 may include at least one processing unit 420 that is operatively coupled to memory 104 through a bus 440 and a user-configurable solid state memory controller 100. Processing unit 420 is representative of one or more circuits configurable to perform at least a portion of a data computing procedure or process. By way of example but not limitation, processing unit 420 may include one or more processors, controllers, microprocessors, microcontrollers, application specific integrated circuits, digital signal processors, programmable logic devices, field programmable gate arrays, and the like, or any combination thereof. Processing unit 420 may include an operating system, one or more applications, and one or more drivers, configured to communicate with user-configurable solid state memory controller 100. Such an operating system, application, and driver may, for example, generate commands to be sent to solid state memory controller 100 over bus 440.

Computing device 404 may include, for example, an input/output 432. Input/output 432 is representative of one or more devices or features that may be configurable to accept or otherwise introduce human and/or machine inputs, and/or one or more devices or features that may be configurable to deliver or otherwise provide for human and/or machine outputs. By way of example but not limitation, input/output device 432 may include an operatively configured display, speaker, keyboard, mouse, trackball, touch screen, data port, etc.

In the previous detailed description of embodiments, reference is made to accompanying drawings which form a part hereof, and in which it is shown by way of illustration specific embodiments of claimed subject matter. It is to be understood that other embodiments may be used, for example, or changes or alterations, such as structural changes, may be made. All embodiments, changes or alterations, including those described herein, are not departures from scope with respect to intended claimed subject matter.

The terms, "and," "and/or," and "or" as used herein may include a variety of meanings that will depend at least in part upon the context in which it is used. Typically, "and/or" as well as "or" if used to associate a list, such as A, B or C, is intended to mean A, B, and C, here used in the inclusive sense, as well as A, B or C, here used in the exclusive sense. Reference throughout this specification to "one embodiment" or "an embodiment" means that a particular feature, structure, or characteristic described in connection with the embodiment is included in at least one embodiment of claimed subject matter. Thus, the appearances of the phrase "in one embodiment" or "an embodiment" in various places throughout this specification are not necessarily all referring to the same embodiment. Furthermore, the particular features, structures, or characteristics may be combined in one or more embodiments.

While there has been illustrated and described what are presently considered to be example embodiments, it will be understood by those skilled in the art that various other modifications may be made, and equivalents may be substituted, without departing from claimed subject matter. Additionally, many modifications may be made to adapt a particular situation to the teachings of claimed subject matter without departing from the central concept described herein. Therefore, it is intended that claimed subject matter not be limited to the particular embodiments disclosed, but that such claimed subject matter may also include all embodiments falling within the scope of the appended claims, and equivalents thereof.

What is claimed is:

1. An apparatus, comprising:
    a memory port comprising a plurality of channels coupled to a memory array that is at least partially interchangeably configurable as high-throughput or low-latency; and
    a controller coupled to the memory port and configured to:
        determine whether a received request is a configuration request comprising instructions to configure a portion of the memory array associated with a subset of the channels as high-throughput or low-latency; and
        responsive to determining that the received request is a configuration request:
            configure the portion of the memory array as high-throughput or low-latency according to the configuration request;
            update a configuration table according to the configuration request;
            responsive to the configuration request comprising instructions to configure the portion of the memory array as low-latency, distribute information to a greater quantity of the channels to reduce latency; and
            responsive to the configuration request comprising instructions to configure the portion of the memory array as high-throughput, distribute information to a lesser quantity of the channels to increase throughput.

2. The apparatus of claim 1, wherein the controller is configured to distribute requests to either the greater quantity of the channels or the lesser quantity of the channels on a partition-by-partition basis.

3. The apparatus of claim 1, wherein the controller is configured to distribute requests to either the greater quantity of the channels or the lesser number of the channels on a sector-by-sector basis.

4. The apparatus of claim 1, wherein the controller is configured to store configuration information for the memory array.

5. A method, comprising:
    determining whether a received request is a configuration request comprising instructions to configure at least one portion of a memory array as high-throughput or low-latency,
    wherein the at least one portion of the memory array is associated with at least one channel of a memory port coupled to the memory array, and
    wherein the memory array is at least partially interchangeably configurable as high-throughput or low-latency; and
    responsive to determining that the received request is a configuration request:
        configuring individual portions of the memory array associated with a plurality of channels of the memory port and the configuration request as high-throughput or low-latency according to the configuration request; and
        updating a configuration table according to the configuration request.

6. The method of claim 5, further comprising:
    responsive to the configuration request comprising instructions to configure the individual portions of the memory array as low-latency, selectively increasing a quantity of the channels to which information is distributed to reduce latency; and
    responsive to the configuration request comprising instructions to configure the portion of the memory array as high-throughput, selectively decreasing a quantity of the channels to which information is distributed to increase throughput.

7. The method of claim 6, further comprising distributing information to an increased quantity of the channels or a decreased quantity of the channels according to the configuration request on a drive-wide basis.

8. The method of claim 6, further comprising distributing information to an increased quantity of the channels or a decreased quantity of the channels according to the configuration request on a partition-by-partition basis.

9. The method of claim 6, further comprising distributing information to an increased quantity of the channels or a decreased quantity of the channels according to the configuration request on a sector-by-sector basis.

10. The method of claim 5, further comprising storing configuration information indicative of portions of the memory array configured as low-latency.

11. The method of claim 5, further comprising storing configuration information indicative of portions of the memory array configured as high-throughput.

12. The method of claim 5, further comprising receiving user input of the configuration request through an application from a host.

13. The method of claim 5, further comprising receiving user input of the configuration request through a driver from a host.

14. An apparatus comprising:
    a memory array, wherein the memory array is accessible through a memory port comprising a plurality of channels and at least partially interchangeably configurable as high-throughput or low-latency; and
    a controller coupled to the memory array and configured to:
        determine whether a received request is a configuration request comprising instructions to configure a portion of the memory array associated with a subset of the channels as high-throughput or low-latency; and
        responsive to determining that the received request is a configuration request:
            configure the portion of the memory array as high-throughput or low-latency according to the configuration request; and
            update a configuration table according to the received configuration request.

15. The apparatus of claim 14, wherein the memory array and the controller comprise a solid state drive (SSD).

16. The apparatus of claim 14, wherein the controller is configured to store configuration information for the memory array.

17. The apparatus of claim 14, further comprising a processor hosting applications to initiate memory requests to access the memory array through the controller.

18. The apparatus of claim 17, wherein the applications provide a user input of the configuration request.

19. The apparatus of claim 14, wherein the controller is configured to:
- responsive to the configuration request comprising instructions to configure the portion of the memory array as low-latency, distribute information into a single one of the channels of the memory port; and
- responsive to the configuration request comprising instructions to configure the portion of the memory array as high-throughput, distribute information into all the channels of the memory port.

* * * * *